US005516812A

United States Patent [19]

Chu et al.

[11] Patent Number: 5,516,812

[45] Date of Patent: *May 14, 1996

[54] UV-MOISTURE DUAL CURE SILICONE CONFORMAL COATING COMPOSITIONS WITH IMPROVED SURFACE TACK

[75] Inventors: Hsien K. Chu, Wethersfield; Robert P. Cross, Simsbury; Lester D. Bennington, East Hartford, all of Conn.

[73] Assignee: Loctite Corporation, Hartford, Conn.

[*] Notice: The term of this patent shall not extend beyond the expiration date of Pat. No. 5,498,642.

[21] Appl. No.: 284,016

[22] Filed: Aug. 1, 1994

Related U.S. Application Data

[63] Continuation-in-part of Ser. No. 276,019, Jul. 15, 1994, Pat. No. 5,498,642, which is a continuation-in-part of Ser. No. 218,452, Mar. 25, 1994, abandoned, which is a division of Ser. No. 14,143, Feb. 19, 1993, Pat. No. 5,300,608, which is a continuation-in-part of Ser. No. 861,143, Mar. 31, 1992, abandoned.

[51] Int. Cl.$^6$ ................................................ C08G 77/20
[52] U.S. Cl. ...................... 522/20; 522/40; 522/46; 522/44; 522/33; 522/99; 522/37; 522/39; 528/12; 528/17; 528/20; 528/32; 524/731; 524/268
[58] Field of Search ................................ 528/12, 17, 20, 528/32; 522/20, 40, 46, 44, 33, 99, 37, 39; 524/731, 268

[56] References Cited

U.S. PATENT DOCUMENTS

| | | | |
|---|---|---|---|
| 4,064,027 | 9/1973 | Gant | 522/172 |
| 4,526,955 | 7/1985 | Bennington et al. | 528/33 |
| 4,528,081 | 7/1985 | Lien et al. | 204/159.13 |
| 4,587,136 | 5/1986 | White et al. | 427/54.1 |
| 4,595,471 | 6/1986 | Preiner et al. | 522/29 |
| 4,699,802 | 10/1987 | Nakos et al. | 427/54.1 |
| 4,728,709 | 3/1988 | Klemarczyk et al. | 528/15 |
| 4,742,092 | 5/1988 | Inoue et al. | 522/27 |
| 4,956,221 | 9/1990 | Gutek | 428/142 |
| 5,008,301 | 4/1991 | Dennis et al. | 522/13 |
| 5,057,348 | 10/1991 | Drain et al. | 428/76 |
| 5,179,134 | 1/1993 | Chu et al. | 522/37 |
| 5,212,211 | 5/1993 | Welch et al. | 522/37 |
| 5,292,849 | 3/1994 | Fujioka et al. | 528/18 |
| 5,300,285 | 4/1994 | Halloran et al. | 424/71 |
| 5,300,608 | 4/1994 | Chu et al. | 528/14 |

FOREIGN PATENT DOCUMENTS

| | | |
|---|---|---|
| 0492828A1 | 3/1991 | European Pat. Off. . |
| 0539234A2 | 10/1992 | European Pat. Off. . |
| 4-69901 | 2/1992 | Japan . |
| 4-143102 | 4/1992 | Japan . |

OTHER PUBLICATIONS

"Spectroscopical Examination of Photopolymerization, Structure and Permeability of Thin Polymer Films," Hoffman, V., et al., *J. Mol. Struct.*, 293, 253–256 (1993). (Database Abstract Only).

"Laser–Induced Polymerization of Siloxanes Without Photoinitiators," Roth, W., et al., *Adv. Mater.*, 2(10), 497–498 (1990). (Database Abstract Only).

"Analysis and Structure of Dicumyl Peroxide Ultraviolet––Cured Poly(Dimethyl Siloxane) Rubber Crosslinks," Barrall, E., et al., *J. Polym. Sci., Polym. Symp.*, 71, 189–202 (1984). (Database Abstract Only).

*Primary Examiner*—Margaret W. Glass
*Attorney, Agent, or Firm*—Steven J. Hultquist

[57] ABSTRACT

A radiation and moisture curable silicone conformal coating composition comprises a silicone fluid of a monovalent ethylenically unsaturated functional group endcapped silicone and at least one (meth)acryl-functionalized silicone; and a photoinitiator effective for radiation curing of the silicone composition. The encapped silicone is the product of a reaction between a silanol terminated silicone and a silane cross linker having joined directly to a silicon atom thereof a monovalent ethylenically unsaturated functional group and at least 2 hydrolyzable groups.

19 Claims, No Drawings

UV-MOISTURE DUAL CURE SILICONE CONFORMAL COATING COMPOSITIONS WITH IMPROVED SURFACE TACK

This is a Continuation-in-part of application Ser. No. 08/276,019, filed 15 Jul. 1994 and now U.S. Pat. No. 5,498,642, which is a Continuation-in-part of application Ser. No. 08/218,452, filed on 25 Mar. 1994 and now abandoned; which is a divisional of application Ser. No. 08/014,143, filed 19 Feb. 1993, now U.S. Pat. No. 5,300,608; which in turn is a Continuation-in-Part of application Ser. No. 07/861,143, filed 31 Mar. 1992, now abandoned.

BACKGROUND OF THE INVENTION

1. Field of the Invention

The present invention relates to dual UV-curable and moisture curable silicone conformal coating compositions and methods of making and using same. In particular, the invention pertains to silicone conformal coating compositions having improved surface tack.

2. Description of the Related Art

Silicone materials are widely used in industry as well as in consumer markets as sealants, adhesives, conformal coatings, potting compounds, etc.

In particular, silicone conformal coatings have found widely accepted applications in the protection of delicate electronic components such as printed circuit boards as well as in abrasion resistant coatings for plastic lenses.

Conventionally, silicone conformal coatings are heat cured using hydrosilylation reactions, or are moisture cured using conventional room temperature vulcanizing.

In the heat cured coatings, silicone fluids with vinyl functional groups are reacted with silicone fluids containing silicon-hydrogen bonds in the presence of a transition metal catalyst, as for example chloroplatinic acid. These severe curing conditions along with the high cost of the catalysts present a serious limitation, however, on the usage of heat cured coatings.

Typically, moisture curable materials are manufactured by endcapping $\alpha$, $\omega$-silanol terminated silicones with various crosslinkers such as alkoxysilanes, oximinosilanes, acetoxysilanes, aminosilanes, and other silanes with hydrolyzable groups attached to the silicon atom(s) thereof.

The resulting silicone materials are stored in moisture impermeable containers. During application to a respective substrate, the materials are extruded or otherwise applied and exposed to ambient conditions for curing. The moisture in the air then will hydrolyze the hydrolyzable groups (alkoxy, oximino, acetoxy, amino, etc.) on the silicon atom(s), to form silanol, either with or without the assistance of an added catalyst.

The resulting silanol can then further react with remaining unhydrolyzed groups in a condensation reaction, to form a siloxane linkage resulting in the cure of the silicone material.

Although these materials are very reliable and possess superior properties as coatings, the moisture cure tends to be slow. Overnight curing is often needed before a full cure can be achieved. This slow cure puts a severe limitation on the manufacture of coated components, since full cure of the coated components is needed before the components can be used in the next step of the manufacture process.

Because of the aforementioned limitations involved with heat or moisture curable silicone formulations, a third curing mode, ultraviolet light (uv) curing, has gained wide acceptance in recent years. The curing is relatively fast and mild to the substrates. In situations where portions of the coated material are shaded during the uv cure, a secondary cure mode, usually moisture cure can be further incorporated.

Typically, uv cure can be achieved by either a thiol-ene cure or by an acrylate cure. In the thiol-ene cure, a thiol functional silicone is reacted with a vinyl functional silicone. The cure is fast and the surface dry to the touch upon the completion of the cure. However, the finished coating resists heat aging poorly and the formulation tends to be storage unstable.

On the other hand, acrylate functional silicone is usually storage stable and the cured coatings exhibit excellent high temperature resistance. However, the acrylate cure typically exhibits oxygen inhibition. That is, in the presence of atmospheric oxygen, the surface cure tends to be incomplete and the resulting cured coating tends to be tacky.

EP 0539 234 pertains to a composition for a liquid gasket having both an ultraviolet-curing property and a moisture-curing property Which is prepared by combining a polysiloxane having at a molecular end at least one group which can be (meth)acryl, a polyorganosiloxane having silanol groups at both molecular ends, an organosilane having at least one hydrolyzable group at a molecular end and a photopolymerization catalyst and a condensation catalyst. The compositions disclosed in this reference are highly viscous, afford a bulk cure and are thus unsuitable for conformal coatings.

Japanese Patent Application No. 4-69901 by Three-Bond Co., Ltd. discloses an ultraviolet-curing, addition-polymerization-type silicone composition which is curable at room temperature. The disclosed silicone composition comprises a polydiorganosiloxane containing vinyl groups and a polydiorganosilane in which at least 4 silicon atoms are directly bonded in the formula $R_5(Si(R_3)(R_4))_nR_6$ in which $R_3$–$R_6$ are alkyl or aryl, and n is 4 or greater, with the proviso that $R_5$ and $R_6$ may be directly bonded to one another. An addition polymerization catalyst is also included in the composition, such as a platinum catalyst. The composition is uv-light curable with the occurrence of radical addition polymerization.

Japanese Patent Application No. 92143102 to Tokyo Three Bond Co. Ltd. describes moisture curable and uv-curable compositions of a composition prepared by adding reactive polysiloxane to less equivalent reactive silane compounds having two or three hydrolysable groups, methacryl groups or epoxy groups and reaction of the composition with compounds having at least one vinyl group and methacryl groups and a moisture curing catalyst.

U.S. Patent No. 5,179,134 to Chu et al. describes an acryloxy-functional capped silicone which is formed as a reaction product of a silyl diacrylate compound and a silicone having at least one functionality which is reactive with an acryloxy functionality of the silyl diacrylate compound to yield the acryloxy-functional capped silicone.

Hoffman, V., et al., *J. Mol. Struct.*, 293, 253–256 (1993) describes oligomers including a vinyl group-containing dimethylsiloxane which are thermally as well as photochemically crosslinkable.

Roth, W., et al., *Adv. Mater.*, 2(10), 497–498(1990) discloses a methylvinyl-dimethylsiloxane composition that is devoid of photoinitiators, and undergoes radical crosslinking when exposed to laser radiation.

Barrall, E., et al., *J. Polym. Sci., Polym. Symp.*, 71, 189–202 (1984) describes uv-cured polydimethylsiloxanes containing pendant vinyl groups, wherein the curing involves dicumyl peroxide-mediated vulcanization.

U.S. Pat. No. 4,064,027 to Gant describes a uv-curable composition consisting essentially of a vinyl-containing siloxane and siloxane-containing, silicon-bonded hydrogen atoms, in which a mercaptofunctional silicone may be employed as a cure accelerator.

U.S. Pat. No. 4,742,092 to Inoue et al. and U.S. Pat. No. 4,595,471 to Preiner et al. show UV and dual UV/moisture curable silicones which employ photocurable (meth)acryloxy and isopropenyloxy group containing silicones in combination with mercapto-containing silicones.

EP 0492828 discloses uv or moisture curable silicones incorporating additives of alkoxy terminated polydiorganosiloxanes in combination with an alkoxy silicone compound having photo reactive moieties.

Accordingly, it would be a substantial advance in the art, and is correspondingly an object of the present invention, to provide a dual uv-curable, moisture curable silicone conformal coating composition wherein uv cure of the composition results in a coating that is dry to the touch without the common tacky surface often associated with an acrylate cure.

Another object of the present invention is to provide an improved room temperature vulcanizing silicone conformal coating composition of such character, which is readily formulated in a convenient manner using conventionally available formulation components.

Other objects and advantages of the invention will be more fully apparent from the ensuing disclosure and appended claims.

SUMMARY OF THE INVENTION

The present invention generally relates to dual uv radiation and moisture-curable room temperature vulcanizing silicone conformal coating compositions.

In one broad aspect, the invention comprises a radiation and moisture-curable silicone composition which may suitably comprise:

a silicone fluid comprised of a monovalent ethylenically unsaturated functional group endcapped silicone, said endcapped silicone being the product of a reaction between a silanol terminated silicone and a silane cross linker having joined directly to a silicon atom thereof a monovalent ethylenically unsaturated functional group and at least 2 hydrolyzable groups; and at least one (meth)acryl-functionalized silicone; and a photoinitiator effective for radiation curing of the silicone composition.

The silanol terminated silicone preferably comprises a linear polydiorganosiloxane having a viscosity as measured on a Brooksfield viscometer at ambient temperature (about 25° C.) of less than or equal to about 1000 cps, preferably less than or equal to about 750 cps and most preferably of less than or equal to about 200 cps.

The silanol-terminated silicone preferably is predominantly linear in character, having the silanol (—SiOH) functionality located at the terminus of a polysiloxy (—(SiO)$_x$—) moiety in the silicone molecule.

The silane cross-linker which reacts with the silanol endcapped silicone in the above-described composition may advantageously have the formula $R_a SiX_b$ wherein:

each R is independently selected from the group consisting of monovalent ethylenically unsaturated radicals, hydrogen, $C_1$–$C_8$ alkyl, $C_6$–$C_{12}$ aryl, $C_7$–$C_{18}$ arylalkyl, $C_7$–$C_{18}$ alkylaryl, and X;

X is a monovalent functionality imparting moisture-curability to the reaction product of the silanol-functionalized silicone and silane cross-linker;

a has a value of 1 or 2;

b has a value of 2 or 3; and a+b=4 with the proviso that when a is 1, R is a monovalent ethylenically unsaturated radical, and that when a is 2, at least one R is a monovalent ethylenically unsaturated radical.

Thus, R may suitably be a monovalent ethylenically unsaturated radical for example selected from the group consisting of vinyl, propenyl, butenyl, pentenyl, hexenyl, octenyl, allyl, alkenyloxy, alkenylamino, allyloxy and allylamino, groups. Specific illustrative species of the crosslinker include vinyltrimethoxysilane, vinyltriaminosilane, vinyltriamidosilane, vinyltrioximinosilane, vinyltriisopropenyloxysilane, and vinyltriacetoxysilane.

Other aspects and features of the invention will be more fully apparent from the ensuing disclosure and appended claims.

DETAILED DESCRIPTION OF THE INVENTION, AND PREFERRED EMBODIMENTS THEREOF

The silicone conformal coating compositions utilize silane crosslinkers containing olefinically unsaturated group(s) attached to the silicon atom of the crosslinker. Such crosslinker upon reacting with the silanol-terminated silicone form the monovalent ethylenically unsaturated functional group endcapped silicone. The composition comprising the ethylenically unsaturated functional group endcapped silicone and at least one (meth)acryl-functionalized silicone is a dual uv/moisture curable conformal coating composition having improved surface tack and relatively fast cure time.

In a preferred embodiment the present invention is directed to a radiation and moisture curable silicone conformal coating composition comprising a first silicone fluid, a second silicone fluid and a photoinitiator effective for radiation curing of the silicone composition. Preferably the first silicone fluid is comprised of a reaction product of a silanol terminated silicone having at least 60 mole percent Si-OH terminal groups and a viscosity, at ambient temperature of 1000 centipoise or less and a silane cross-linker having a monovalent, radiation curable ethylenically unsaturated functional group and at least 2 hydrolyzable groups. The second silicone fluid preferably has both radiation curable (meth)acryl function groups and moisture curable hydrolyzable groups. The mole ratio of the ethylenically unsaturated groups to the (meth)acryl functional groups is preferably from about 5:95 to about 4:6 and most preferably from about 1:5 to about 35:65.

The present invention includes compositions wherein the first and second silicone fluids are prepared concurrently from a silanol terminated silicone having at least 60 mole percent Si-OH terminal groups and a viscosity, at ambient, of 1000 centipoise or less and at least two silane cross-linkers. One of the cross-linkers has a monovalent, radiation curable ethylenically unsaturated group and at least two hydrolyzable groups and at least one other silane has a (meth)acryl functional group and at least two hydrolyzable groups.

The present inventors unexpectedly discovered that even though the first and second silicone fluids each have a viscosity which is preferably less than or equal to about 1000 cps and which in and of itself has poor photo-curing ability, when present in the present silicone conformal coating compositions, upon formulation with common photoinitiators such as diethoxyacetophenone, can undergo light (actinic radiation exposure) cure in a relatively short period of time to form a firm, non-tacky surface "skin" that possesses structural integrity.

Thus, when ethylenically-unsaturated silane capping species, such as vinyltrimethoxysilane, vinyltrioximinosilane, vinyltriisopropenyloxysilane, and vinyltriacetoxysilane, are used to endcap silanol-terminated fluids, to form vinyl-functional products, such as vinyldimethoxy-, vinyldioximinoxy- and vinyldiacetoxy-terminated fluids, respectively and such fluids are added to (meth)acryl functionalized silicones, upon the addition of photoinitiators such fluids undergo uv cure to form strong, non-tacky films when exposed to suitable actinic radiation of curingly effective character. The resulting radiation-cured conformal coating is typically sufficiently strong to provide the requisite protection to the substrate upon which it coats.

Ambient temperature (typically, from about 0° C. to about 30° C.) atmospheric moisture (normal relative humidity (RH), e.g., from about 2% to 100% RH) exposure conditions can, subsequent to the aforementioned light-induced cure of the composition, be utilized to effect moisture-curing of the RTV silicone material which may be shaded from the radiation source.

Thus, silicone formulations of the present invention can be sequentially polymodally cured, by initial actinic radiation, e.g., uv cure, and subsequent moisture cure, and such silicone formulations are also curable in toto by moisture cure only. In either event (polymodal curing involving sequential initial radiation surface curing followed by bulk interior volume moisture-curing, or unimodal curing involving only moisture curing of the entire silicone formulation), the physical properties of the respective cured materials are substantially the same.

The present invention, as a result of its susceptibility to being cured by radiation impingement as well as (or alternatively) by RTV moisture curing, thereby permits great flexibility in use, particularly in instances where the geometric or positional character of the substrate(s) to which the composition is applied would otherwise cause shading of the silicone composition from the actinic radiation source. In such instances, the applied silicone conformal coating composition of the invention can be moisture cured via RTV crosslinking wherein the slow moisture cure can be allowed to take place under normal atmospheric moisture exposure conditions.

Alternatively, in instances where the applied silicone conformal coating material is not susceptible to shading, phenomena, the material can be fully and solely cured by exposure to actinic radiation. The composition of the present invention is curable at ambient temperature conditions, without any net addition or application of heat to such silicone composition.

The present invention is useful in forming non-tacky coatings which are not inhibited by the presence of oxygen, as is commonly the case with uv cure involving (meth)acrylate functional groups. While there may be some oxygen inhibition of the (meth)acryl groups, this oxygen inhibition appears to be masked by the presence in the composition of monovalent ethylenically unsaturated groups, especially vinyl groups. As used herein, the term "non-tacky" in reference to the surface of a silicone compositional mass subjected to radiation exposure, means that such surface is deformable, but touch-resilient or non-adherent to, and non-deformed by, the touch, i.e., contact of a human finger with such surface.

The present invention also contemplates the provision of a dual cure silicone composition comprising a uv cure/moisture cure dielectric gel, in applications where ultraviolet radiation used to effect the uv cure is not accessible to the entire surface of the applied dielectric gel mass, so that the exterior of the mass includes radiation-accessible (direct impingement) regions as well as shadow regions that are physically blocked from radiation impingement by electronic components or other devices.

In such "shadow cure" applications of dielectric gels or other silicone compositions of the present invention, both the direct impingement radiation cured/moisture cured regions of the conformal coating, as well as the shadow regions where only moisture-cure took place, would exhibit similar physical properties (e.g., non-tackiness, hardness, toughness, thermal resistance, tensile strength, fracture resistance, temperature stability, compressive strength, etc.) in the final cured material.

The silicone conformal coating compositions may be cured by exposure to any radiation conditions that are curingly-effective for the composition. Suitable radiant energy types that may be usefully employed in the broad practice of the invention include electron beam radiation, ultraviolet radiation, visible light radiation, gamma radiation, X-rays, $\beta$-rays, etc. Preferably, the photocuring radiation is actinic radiation, i.e., electromagnetic radiation having a wavelength of about 700 nm or less that is capable of effecting cure of the silicone composition. Most preferably, the photocuring radiation comprises ultraviolet (uv) radiation, e.g., from about 200 to about 540 nm.

It will be recognized that the type and character of the photocuring radiation that is used to form a cured conformal coating of the present invention after its application to a substrate or other locus of use, may be widely varied within the broad scope of the present invention, and that the curing radiation exposure cure times are correspondingly variable, with respect to and depending on such factors as: the particular silicone formulation employed, type and light-responsiveness of the specific photoinitiator employed, the wavelength and flux of the radiation, the concentration of the photoinitiator in the composition, and the thickness of the coating.

Generally, the radiation exposure time is relatively short, that is, less than about 3 minutes. Exposing the composition to excessive amounts of radiation may "overcure" the composition, resulting in poor physical and performance properties. The amount of radiation that is excessive varies with the given formulation of the silicone composition, coating thickness, radiation source, etc., and may readily be determined by the skilled artisan without undue experimentation.

Correspondingly, the thickness of the radiation-cured conformal coating that is efficacious to provide the required structural stability and protection of the underlying substrate is readily determinable within the skill of the art by routine and simple experimentation. Generally, conformal coatings are on the order of less than about 15 mils thick, generally, from about 3 to about 10 mils thick.

The depth of cure required in a given end use application may be empirically established by exposure of corresponding amounts of the conformal coating composition on separate substrate samples to varying amounts of radiation (or other varying parameters, e.g., amounts in the respective compositional samples of photoinitiator; or amounts of filler; or distances between the applied coating and the radiation source; etc.), followed by touching the samples to determine which composition samples are tacky to the touch.

The silanol-terminated silicone utilized to form the ethylenically unsaturated functional group endcapped silicone in the composition of the present invention may suitably comprise a linear polydiorganosiloxane, or other linear silicone, having a weight average molecular weight which may for example range from about 166 to about 20,000 preferably from about 500 to about 12,000, and most preferably from about 800 to about 8000. The silanol-terminated silicone has a viscosity at ambient temperature (about 25° C.) of less than or equal to about 1000 cps, preferably less than or equal to about 750 cps, and most preferably of less than or equal to about 200 cps.

Although such silicone is preferably linear in conformation, other, non-linear silicones, e.g., branched, cyclic or macromeric, may be usefully employed in the broad practice of the present invention. Preferably, the silicone (polysiloxane) is predominantly linear in character. The silanol (—SiOH) functionality is located at the terminus of a polysiloxy (—(SiO)$_x$—) moiety in the silicone molecule, the hydroxy functionality is covalently bonded to a terminal silicon atom of the polysiloxy backbone, in the case of a linear silicone, or to a terminal silicon atom of a main or side chain or other aggregation of siloxy repeating units in the case of a branched or otherwise nonlinear silicone molecular conformation.

Preferably, the polysiloxane is a linear molecule both of whose terminal functional groups comprise hydroxy groups. Thus, for example, the polysiloxane material may comprise a hydroxy-terminated polydimethylsiloxane, a hydroxy-terminated polydiphenylsiloxane or a hydroxy-terminated methylphenyl polysiloxane. Preferably, the silicone is an organopolysiloxane whose organo substituents are predominantly methyl.

A particularly preferred polysiloxane material which has been usefully employed in the practice of the present invention is a hydroxy-terminated polydimethylsiloxane of linear configuration, having a weight average molecular weight as determined by nuclear magnetic resonance on the order of 4,000.

The silane cross-linker employed in the compositions of the invention for endcapping of the silanol-terminated silicone to obtain the monovalent ethylenically unsaturated functional group endcapped silanol, comprises a silane compound having joined directly to a silicon atom thereof at least one ethylenically unsaturated functional group and at least two hydrolyzable functional groups.

The silane cross-linker may for example have the formula $R_aSiX_b$ wherein:
each R is independently selected from the group consisting of monovalent ethylenically unsaturated radicals, hydrogen, $C_1$–$C_8$ alkyl, $C_6$–$C_{12}$ aryl, $C_7$14 $C_{18}$ aryalkyl, $C_7$–$C_{18}$ alkylaryl, and X;
X is a monovalent functionality imparting moisture-curability to the reaction product of the silanol-terminated silicone and non-mercapto group containing silane cross-linker;
a has a value of 1 or 2;
b has a value of 2 or 3; and
a+b=4 with the proviso that when a is 1, R is a monovalent ethylenically unsaturated radical, and that when a is 2, at least one R is a monovalent ethylenically unsaturated radical.

In such cross-linker formula, the monovalent ethylenically unsaturated radical may for example contain from 2 to 12 carbon atoms. Illustrative monovalent ethylenically unsaturated radicals suitable for the cross-linker include vinyl, propenyl, butenyl, pentenyl, hexenyl, octenyl, allyl, alkenyloxy, alkenylamino, allyloxy and allylamino groups. Preferably, the monovalent ethylenically unsaturated radical is selected from the group consisting of vinyl and allyl groups, and most preferably, the monovalent ethylenically unsaturated radical is vinyl.

Illustrative silane cross-linker species which may be utilized in practicing the present invention include vinyltrimethoxysilane, vinyltri-aminosilane, vinyltriamidosilane, vinyltrioximinosilane, vinyltriisopropenyloxysilane and vinyltriacetoxysilane.

As used herein, the term "vinyl" refers to the group $CH_2$=CH—.

The silane cross-linker may be used at any suitable concentration in the silicone composition of the present invention which is cross-linkingly effective for the silicone, as may be stoichiometrically determined in a straightforward manner within the skill of the art, or as may be readily empirically determined within the skill of the art by varying the concentration of the cross-linker relative to the silanol-terminated silicone in the silicone composition, and cross-linking the composition in the presence of moisture, with and/or without initial surface-radiation-curing of the composition. The amount is preferably from slightly less to slightly more than the stoichiometric amount based on SiOH with the goal being to endcapped all available SiOH's.

By way of example, in the case of compositions of the present invention utilizing silane cross-linker species such as vinyltrimethoxysilane, vinyltriaminosilane, vinyltriamidosilane, vinyltrioximinosilane, vinyltriisopropenyloxysilane and vinyltriacetoxysilane, the cross-linker concentration is generally on the order of from about 1% to 50% by weight, based on the weight of the silanol-terminated silicone.

The present composition may further comprise a nonreactive moiety endcapped silicone in order to modify the viscosity of the silicone fluid. Suitable nonreactive moiety endcapped silicones for use in the present invention include, but are not limited to, alkyl, aryl, arylalkyl, and alkylaryl endcapped silicone. An example of a specific nonreactive moiety endcapped silicone suitable for use in the invention is trimethylsilyl endcapped polydimethylsiloxane.

In the present composition said at least one (meth)acryl-functionalized silicone has at least one acryl or methacryl a functional group and at least one hydrolyzable group which is selected from the same hydrolyzable groups on the monovalent ethylenically unsaturated functional group endcapped silicone. Preferred functionalized silicones are the methacryloxy or acryloxy alkyl or methacryloxy or acryloxy alkenyl functionalized silicones. Suitable (meth)acryl-functionalized silicones for use in the present invention include, but are not limited to, methacryloxypropyldimethoxysilyl terminated silicone, acryloxypropyldimethoxysilyl terminated silcone or a mixture thereof. (Meth)acryl-functionalized silicones are known and can be prepared in accordance with any known method including those exemplified in U.S. Pat. Nos. 4,503,208; 4,504,629; 4,575,545; 4,575,546;

4,760,122; 4,290,869 and 4,595,471, the entire disclosures of which are all hereby incorporated herein by reference.

The photoinitiator employed in silicone compositions of the present invention may include any photoinitiator known in the art that is useful to effect photopolymerization of ethylenically unsaturated (e.g., vinyl or allyl) compounds in the presence of curingly effective radiation.

Potentially useful photoinitiators may include, by way of example, benzoin, substituted benzoins such as benzoin ethyl ether, benzophenone, benzophenone derivatives, Michler's ketone, dialkoxyacetophenones such as diethoxyacetophenone, acetophenone, benzil, and other derivatives (substituted forms) and mixtures thereof. A particularly preferred photoinitiator material is diethoxyacetophenone. Although any suitable effective amount of photoinitiator may be employed in the surface photocurable silicone compositions of the invention, generally the photoinitiator concentration will be usefully employed in the range of about 0.1% to about 15% by weight, and more specifically and preferably from about 0.2% to about 5% by weight, based on the weight of the curable components of the composition.

The photoinitiator employed in the photocurable silicone compositions of the present invention may also be polymer bound. Such photoinitiators are described in U.S. Pat. Nos. 4,477,326 and 4,587,276. Other free radical initiators, such as peroxy thermal initiators may be used in some of the lower molecular weight silicone formulations of the invention.

Preferably, the ethylenically unsaturated functional group endcapped silicone is present in an amount which is from about 20 to about 35 parts by weight, the (meth) acrylate functionalized silicone fluid is present in an amount which is from about 80 to about 65 parts by weight and the photoinitiator is present in an amount which is from about 1 to about 15 parts by weight of the composition.

Suitable moisture cure initiators for use in the present invention include any such initiators known in the art including orthotitanate.

The compositions of the present invention may also include other ingredients to modify the cured or uncured properties of the composition, as necessary or desirable for a specific end use application.

Fillers or reinforcing materials may usefully be employed in compositions of the present invention to provide enhanced mechanical properties, and in some instances enhanced UV radiation surface curability of the composition.

Among preferred fillers are reinforcing silicas. The reinforcing silicas are fumed silicas which may be untreated (hydrophilic) or treated to render them hydrophobic in character.

In general, fillers may be employed at any suitable concentration in the curable silicone conformal coating composition, but generally are present at concentrations of from about 5 to about 45% by weight, based on the weight of the polysiloxane. Generally, any other suitable mineralic, carbonaceous, glass or ceramic fillers may be potentially advantageously be employed. Examples include ground quartz, tabular alumina, diatomaceous earth, silica balloons, calcium carbonate, carbon black, titanium oxide, aluminum oxide, aluminum hydroxide, zinc oxide, glass fibers, etc.

In addition, the silicone conformal coating compositions of the present invention may also optionally contain an adhesion promotor, to enhance the adhesive character of the composition for a specific substrate (e.g., metal, glass, ceramic, etc.), when the composition is employed as an adhesive for bonding of respective substrate elements or members.

Any suitable adhesion promotor constituents may be employed for such purpose, depending on the specific substrate elements or members employed in a given application. For example, the adhesion promotor might be selected to enhance the adhesion of the composition on substrates comprising materials such as metals, glasses, ceramics, plastics, and mixtures, blends, composites, and combinations thereof.

Various organosilane compounds may be usefully employed for such purpose, and such compounds may also feature oxirane functionality, as well as silicon-bonded alkoxy substituents, to provide broad adhesive bonding utility. In such organosilane compounds, the oxirane functionality may be provided by a glycidoxyalkyl substituent on a silicon atom of the silane compound. A particularly preferred adhesion promotor of such type is glycidoxypropyltrimethoxysilane.

In addition, further additives such as MQ or MDQ resins can be incorporated, to vary the properties of the silicone conformal coating composition as desired.

Besides the constituents identified above as being optionally includable in the silicone conformal coating compositions of the present invention, further optional constituents include anti-oxidants, flame retardants, and pigments, etc., as well as filler adjuvants, e.g., filler-treating agents such as hydroxy-terminated vinylmethoxysiloxane, for filler treatment of quartz or similar fillers when used in the composition.

In respect of filler components of the silicone compositions of the present invention, it will be appreciated that the use of filler materials may significantly alter the depth of the surface cure of the compositional mass, and fillers may therefore be usefully employed to attain a predetermined desired cured coating thickness.

Radiation exposure surface curing of the silicone conformal coating compositions of the present invention may suitably be carried out in an ambient atmosphere or in an inert atmosphere such as nitrogen or argon atmosphere. Moisture curing of moisture-curable compositions of the present invention is typically suitably carried out in ambient atmospheric exposure conditions, but such curing may alternatively be conducted in an elevated humidity cabinet or other synthetic high humidity environment for the requisite moisture curing period, which may be readily determined within the skill of the art in relation to determination of the product final moisture-cured properties.

The silicone conformal coating compositions of the present invention utilize components that are easily synthesized within the skill of the art, and/or are readily commercially available.

In making the silicone conformal coating compositions of the present invention, the silanol-terminated silicone component and the silane cross-linker may be reacted with one another at ambient temperature, e.g., at room temperature in the range of 20° C. –30° C., for sufficient time to complete the reaction to form the monovalent ethylenically unsaturated functional group endcapped silicone component of the present composition, typically 0.5 to 4 hours. Alternatively, elevated temperature may be employed to speed the rate of reaction, however, ambient temperature conditions are generally satisfactory and preferred for ease of synthesis.

The reaction mixture may optionally, if desired, include a suitable catalyst, such as an organometallic compound (e.g., butyllithium) to facilitate the reaction between the silanol-terminated silicone reactant and the at least one silane crosslinker. After the desired extent of reaction, such catalyst may be quenched, for example by addition of acid in the case of organometallic reagents.

After the reaction between the silanol-terminated silicone reactant and the silane crosslinker has been carried out, the silicone fluid reaction product is simply admixed with the methacryl-functionalized silicone and with the photoinitiator for subsequent exposure of the resulting coating composition to photopolymerizingly effective radiation to surface-cure the composition. The silicone fluid reaction product may thus be admixed with the photoinitiator under non-radiation-exposure conditions, and the resulting mixed composition may be stored in containers which are non-transmissive of photopolymerizingly effective radiation, as a single package composition for subsequent use. Alternatively, the silicone fluid reaction product may be utilized as a two-part or two-package system, in which the silicone fluid reaction product is admixed with the photoinitiator component at the time of use, immediately before application thereof to the locus of use, and surface-curing irradiation of the applied mixed composition.

The conformal coating silicone compositions of the present invention, in addition to their use in conformal coatings, may be variously formulated for suitable use in any variety of coating applications known in the art.

The features and advantages of the invention are more fully illustrated in the following non-limiting examples, wherein all parts and percentages are by weight, unless otherwise expressly stated.

EXAMPLE 1

Six hundred grams of a 40 cps (Brooksfield viscometer) silicone fluid, 80% of which had silanol terminal ends and 20% of which had trimethylsilyl ends was mixed with two hundred fiftyseven grams of methacryloxypropyltrimethoxysilane in a reactor with nitrogen sparge. Butyllithium catalyst (1.6M; 0.36 g) was added to the mixture. The mixture was stirred with nitrogen sparge for 90 minutes and then sparged with carbon dioxide for 30 minutes. The mixture was then vacuum stripped at 70 C for 1 hour to obtain a silicone fluid which was 80% methacryloxypropyldimethoxy terminated and 20% trimethylsilyl terminated and designated as Fluid M.

EXAMPLE 2

Two hundred forty one grams of the 40 cps silicone fluid with 80% silanol terminated ends and 20% trimethylsilyl ends was allowed to react with ninety grams of acryloxypropyltrimethoxysilane in the presence of 0.5 ml of butyllithium (1.6M) in accordance with the procedure set forth in Example 1 to obtain an 80% acryloxypropyldimethoxysilyl terminated, 20% trimethylsilyl terminated silicone fluid designated as Fluid A.

EXAMPLE 3

Two hundred fifty seven grams of the 40 cps silicone fluid with 80% silanol terminated ends and 20% trimethylsilyl ends was allowed to react with 61.7 grams of vinyltrimethoxysilane in the presence of 0.2 ml of butyllithium (1.6M) in accordance with the procedure set forth in Example 1 to obtain an 80% vinyldimethoxysilyl terminated, 20% trimethylsilyl terminated silicone fluid designated as Fluid V.

EXAMPLE 4

Two hundred sixty grams of the 40 cps silicone fluid with 80% silanol terminated ends and 20% trimethylsilyl ends was allowed to react with 35 grams of methacryloxypropyltrimethoxysilane, 33 grams of acryloxypropyltrimethoxysilane and 21 grams of vinyltrimethoxysilane in the presence of 0.3 ml of butyllithium (1.6M) in accordance with the procedure set forth in Example 1 to obtain a silicone fluid of approximately 27% methacryloxypropyldimethoxysilyl ends, 26% acryloxypropyldimethoxysilyl ends, 27% vinyldimethoxysilyl ends and 20 trimethylsilyl ends, designated as Fluid MAV.

Example 4 embodies an alternative method for the preparation of the compositions of the present invention wherein the first and second silicone fluids are prepared concurrently from an appropriate silanol or silanol mixture and first silane having a monovalent, radiation curable ethylenically unsaturated group and at least two hydrolyzable groups and at least one other silane having a (meth)acryl functional groups and at least two hydrolyzable groups. It is recognized that one silicone fluid may have both a radiation curable ethylenically unsaturated group and a radiation curable (meth)acryl functional group. However, because of the mole ratio of these moieties, at least some of the silicone fluids having the (meth)acryl functional groups will be free of the ethylenically unsaturated group. The mole ratio of silanes is dependent upon the level of monovalent, radiation curable ethylenically unsaturated groups desired with the total amount of silanes being about the stoichiometric amount relative to the SiOH functionality of the starting silanol fluid.

EXAMPLE 5

Seven sample formulations (Samples 1–7) were prepared wherein the silicone fluids obtained from the procedures set forth in Examples 1–4 were included in varying ratios as set forth for each sample in Table I below. Diethoxyacetophenone in the amount of 6.5% based on weight of total silicones, was added to each sample as the photoinitiator. Approximately 0.5 grams of each sample formulation was poured into an aluminum dish of approximately 65 mm diameter. The material was spread to coat the whole base of the dish to an approximate thickness of 5 mil. The coating was subjected to uv irradiation using a Fusion System ultraviolet light source with a light intensity of ~60 milliwatts per square centimeter (mw/cm$^2$) for various durations as set forth in Table I.

Tackiness of the resulting uv cured coatings were determined by lightly touching the coating with a finger. A number of 0–5 was then assigned to each coating. The number grade denotes the tackiness of the surface cure and is defined as below:

0= no cure

1= some thickening of the coating fluid, surface remains liquid covered.

2= significant thickening of the fluid, when touched upon, the fluid momentarily maintained a fingerprint mark, 3= coating cured to a gum, leaves a fingerprint mark when touched, 4= coating is cured but tacky, 5= coating is fully cured with a dry to the touch surface.

The 7 sample formulations used and their tackiness performances at different levels of curing are shown in Table I below:

TABLE I

| SAMPLE | 1 | 2 | 3 | 4 | 5 | 6 | 7 |
|---|---|---|---|---|---|---|---|
| Fluid M | 93.5% | 73.5% | 73.5% | 73.5% | 0% | 0% | 0% |
| Fluid V | 0% | 20% | 0% | 0% | 93.5% | 0% | 0% |
| Fluid A | 0% | 0% | 20% | 0% | 0% | 93.5% | 0% |
| Fluid MAV | 0% | 0% | 0% | 20% | 0% | 0% | 93.5% |
| DEAP | 6.5% | 6.5% | 6.5% | 6.5% | 6.5% | 6.5% | 6.5% |
| UV 60 sec | 5 | 5 | 5 | 5 | 0 | 5 | 5 |
| 30 sec | 2 | 3 | 1 | 1 | 0 | 2 | 4 |
| 25 sec | 1 | 2 | 2 | 2 | 0 | 1 | 4 |
| 20 sec | 1 | 2 | 1 | 1 | 0 | 1 | 3 |
| 15 sec | 1 | 2 | 1 | 0 | 0 | 0 | 3 |
| 10 sec | 0 | 1 | 0 | 0 | 0 | 0 | 2 |

The results set forth in Table I indicate that presence of Fluid V resulted in a much improved surface cure than of Fluid M by itself (Sample 1) or Fluid A by itself (Sample 6). Fluid V by itself (Sample 5), however, performed poorly. The best performance was with Fluid MAV (Sample 7).

EXAMPLE 6

Seven additional sample formulations (Samples 8–14) were prepared wherein the silicone fluids obtained from the procedures set forth in Examples 1–4 were included in varying ratios as set forth for each sample in Table II below. Diethoxyacetophenone in the amount of 6.5% based on weight of total silicones, was added to each sample as the photoinitiator and tetraisopropyl titanate was added as a moisture cure initiator. Each sample formulation coating was subjected to uv cure according to the procedure set forth for samples 1–7 in Example 5 above. The samples were further allowed to moisture cure to non-tacky coatings. Surface tack immediately after the uv cure, but before the moisture cure were determined as set forth in Example 5. The formulations for samples 8—and the performances are set forth in Table II below.

TABLE II

| SAMPLE | 8 | 9 | 10 | 11 | 12 | 13 | 14 |
|---|---|---|---|---|---|---|---|
| Fluid M | 93.1% | 73.1% | 73.1% | 73.1% | 0% | 0% | 0% |
| Fluid V | 0% | 20% | 0% | 0% | 93.1% | 0% | 0% |
| Fluid A | 0% | 0% | 20% | 0% | 0% | 93.1% | 0% |
| Fluid MAV | 0% | 0% | 0% | 20% | 0% | 0% | 93.1% |
| DEAP | 6.5% | 6.5% | 6.5% | 6.5% | 6.5% | 6.5% | 6.5% |
| TIPT | 0.4% | 0.4% | 0.4% | 0.4% | 0.4% | 0.4% | 0.4% |
| UV 60 sec | 5 | 5 | 5 | 5 | 0 | 5 | 5 |
| 30 sec | 5 | 5 | 5 | 5 | 0 | 5 | 5 |
| 25 sec | 2 | 3 | 4 | 4 | 0 | 4 | 4 |
| 20 sec | 1 | 2 | 2 | 2 | 0 | 2 | 3 |
| 15 sec | 0 | 2 | 2 | 2 | 0 | 2 | 3 |
| 10 sec | 0 | 1 | 1 | 1 | 0 | 1 | 2 |

The results set forth in Table II indicate that partial replacement of Fluid M by Fluid V resulted in a much improved surface cure than of Fluid M by itself even though Fluid v itself would not surface cure (Sample 12). Overall results were such that presence of vinyl provided a faster to the touch cure. It is believed that the presence of moisture cure catalyst combined with heat of the photocure enhanced surface cure of acrylate and methacrylate compositions. Even though acrylate composition appears to perform nearly as well as vinyl containing compounds, the vinyl resins do not have environmental, health and safety concerns associated with acryl functional silicone.

EXAMPLE 7

Forty grams of 100 cps (Brooksfield viscometer) silanol-terminated polydimethylsiloxane fluid with a number average molecular weight of 4,000 (nuclear magnetic resonance) is mixed (endcapped) with 5 grams of vinyltris (methylethylketoximino)silane. The initially cloudy mixture becomes clear in a matter of seconds when encapping is complete to obtain a vinylbis(methylethylketoximino)silane terminated silicone fluid. To the fluid mixture is further added 0.675 g of diethoxyacetophenone.

To an aluminum dish with a diameter of 65 mm is added 0.5 g of the above formulation. The material is allowed to spread to cover the whole dish. The thickness of the coating coverage is approximately 6 mils. UV irradiation of the coating using a Fusion System (medium pressure mercury lamp) at a radiation flux of $\cong 75$ milliwatts/cm$^2$ for one minute results in a soft cured silicone coating that is dry to the touch. The coating will further moisture cure to give a hard silicone coating.

In contrast, when methyltris(methylethylketoximino)silane is used in place of vinyltris(methylethylketoximino)silane in the above formulation, the resulting material shows no uv curing capability under identical curing conditions. The material remains liquid after attempted uv curing. The material does moisture cure to a silicone coating after a few hours standing.

While the invention has been illustratively described herein with reference to various preferred features, aspects and embodiments, it will be appreciated that the invention is not thus limited, and may be widely varied in respect of alternative variations, modifications, and other embodiments, and therefore the invention is to be broadly construed as including such alternative variations, modifications and other embodiments, within the spirit and scope of the invention as claimed.

What is claimed is:

1. A radiation- and moisture-curable silicone composition which in exposure to radiation is surface cured to form a firm, non-tacky surface skin overlying a bulk interior moisture-curable volume of the composition, said composition comprising:

a first silicone fluid comprising a silicone endcapped with vinyl functionality, said endcapped silicone being the reaction product of a silanol-terminated silicone having at least 60 mole percent Si-OH terminal groups and a viscosity, at room temperature, of 1000 centipoise or less and a silane cross-linker having at least one vinyl functional group and at least 2 hydrolyzable functional groups;

a second silicone fluid having both radiation-curable (meth)acryl functional groups and moisture-curable hydrolyzable groups; and a photoinitiator effective for radiation curing of the silicone composition, wherein the mole ratio of the vinyl functional groups to the (meth)acryl functional groups is from 5:95 to 4:6.

2. A composition according to claim 1, wherein the first and second silicone fluids are prepared concurrently from a silanol terminated silicone having at least 60 mole percent Si-OH terminal groups and a viscosity, measured at room temperature, of 1000 centipoise or less, and at least two silane cross-linkers, one of said cross-linkers having at least one vinyl functional group and at least two hydrolyzable groups and the other of said cross-linkers having at least one (meth)acryl functional group and at least two hydrolyzable groups.

3. A composition according to claim 1, wherein the mole ratio of the vinyl functional groups to the (meth)acryl functional groups is from 1:5 to 35:65.

4. A composition according to claim 1, wherein the silanol-terminated silicone has a viscosity as measured at room temperature of less than or equal to about 750 cps.

5. A composition according to claim 4, wherein the silanol-terminated silicone has a viscosity as measured at room temperature of less than or equal to about 200 cps.

6. A composition according to claim 1, further comprising a nonreactive moiety-endcapped silicone.

7. A composition according to claim 6, wherein the nonreactive moiety-endcapped silicone is selected from the group consisting of alkyl-, aryl-, arylalkyl-, and alkylaryl-endcapped silicone.

8. A composition according to claim 7, wherein the nonreactive moiety-endcapped silicone is trimethylsilyl endcapped silicone.

9. A composition according to claim 1, further comprising a moisture-cure initiator.

10. A composition according to claim 9, wherein the moisture-cure initiator is an orthotitanate.

11. A composition according to claim 1, wherein the vinyl functional group contains from 2 to 12 carbon atoms.

12. A composition according to claim 1, wherein said silane cross-linker is selected from the group consisting of vinyltrimethoxysilane, vinyltriaminosilane, vinyltriamidosilane, vinyltrioximinosilane, vinyltris(methyl ethylketoximino)silane, vinyltriisopropenyloxysilane and vinyltriacetoxysilane.

13. A composition according to claim 1, wherein said (meth)acryl functional group is selected from the group consisting of methacryloxyalkyl, methacryloxy alkenyl, acryloxyalkyl, and acryloxyalkenyl groups.

14. A composition according to claim 1, wherein said second silicone fluid is selected from the group consisting of methacryloxypropyldimethoxysilyl terminated silicone, acryloxypropyldimethoxysilyl terminated silicone, and a mixture thereof.

15. A composition according to claim 1, wherein the photoinitiator is selected from the group consisting of benzoin, benzophenone, Michler's ketone, dialkoxy-acetophenones, acetophenone, benzil, and substituted derivatives and mixtures thereof.

16. A composition according to claim 1, wherein the photoinitiator is diethoxyacetophenone.

17. A composition according to claim 1, wherein the photoinitiator has a concentration of from about 0.1% to about 15% by weight, based on the weight of the curable components of the composition.

18. A composition according to claim 1, wherein the first silicone fluid is present in an amount which is from about 20 to about 35 parts by weight, the second silicone fluid is present in an amount which is from about 80 to about 65 parts by weight and the photoinitiator is present in an amount which is from about 1 to about 15 parts by weight of the composition.

19. A radiation- and moisture-curable silicone composition according to claim 1, wherein said silane cross-linker has the formula:

wherein:

R is vinyl;

X is a monovalent functionality imparting moisture-curability to the functional group endcapped silicone;

a has a value of 1 or 2;

b has a value of 2 or 3; and a+b=4.

* * * * *

UNITED STATES PATENT AND TRADEMARK OFFICE
CERTIFICATE OF CORRECTION

PATENT NO.   : 5,516,812
DATED        : May 14, 1996
INVENTOR(S)  : Hsien K. Chu, et al.

It is certified that error appears in the above-indentified patent and that said Letters Patent is hereby corrected as shown below:

Column 7, Line 62,   change "$C_7 14C_{18}$" to -- $C_7$-$C_{18}$ --.
Column 13, line 35,  change "8--" to -- 8-14 --.

Signed and Sealed this

Twentieth Day of August, 1996

Attest:

BRUCE LEHMAN

*Attesting Officer*          *Commissioner of Patents and Trademarks*